US012683570B2

(12) United States Patent

Feng et al.

(10) Patent No.: US 12,683,570 B2

(45) Date of Patent: Jul. 14, 2026

(54) FILTER, INTEGRATED PASSIVE DEVICE, ELECTRONIC DEVICE AND DISPLAY APPARATUS

(71) Applicants: Beijing BOE Optoelectronics Technology Co., Ltd., Beijing (CN); BOE Technology Group Co., Ltd., Beijing (CN)

(72) Inventors: Yulin Feng, Beijing (CN); Yue Li, Beijing (CN); Yuelei Xiao, Beijing (CN); Xue Cao, Beijing (CN); Huiying Li, Beijing (CN); Chunnan Feng, Beijing (CN); Yifan Wu, Beijing (CN); Qichang An, Beijing (CN); Biqi Li, Beijing (CN)

(73) Assignees: Beijing BOE Optoelectronics Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 320 days.

(21) Appl. No.: 18/697,378

(22) PCT Filed: Oct. 21, 2022

(86) PCT No.: PCT/CN2022/126805

§ 371 (c)(1),
(2) Date: Mar. 29, 2024

(87) PCT Pub. No.: WO2024/082296

PCT Pub. Date: Apr. 25, 2024

(65) Prior Publication Data

US 2026/0142638 A1 May 21, 2026

(51) Int. Cl.
*H03H 7/01* (2006.01)

(52) U.S. Cl.
CPC ........ *H03H 7/0161* (2013.01); *H03H 7/0115* (2013.01)

(58) Field of Classification Search
CPC ........................... H03H 7/0161; H03H 7/0115
See application file for complete search history.

(56) References Cited

U.S. PATENT DOCUMENTS

| | | | |
|---|---|---|---|
| 11,757,424 B2 * | 9/2023 | Sato ..................... | H03H 7/1741 |
| | | | 333/167 |
| 12,334,894 B2 * | 6/2025 | Matsumoto .......... | H03H 7/0115 |

(Continued)

FOREIGN PATENT DOCUMENTS

| | | |
|---|---|---|
| CN | 1930776 B | 2/2012 |
| CN | 210016446 U | 2/2020 |
| JP | 2012253526 A | 12/2012 |

*Primary Examiner* — Andrea Lindgren Baltzell
*Assistant Examiner* — Kimberly E Glenn
(74) *Attorney, Agent, or Firm* — Workman Nydegger

(57) ABSTRACT

Embodiments of the present disclosure provide a filter, an integrated passive device, an electronic device, and a display apparatus. The filter is applied in the field of radio frequency and includes: a first port, a second port, a first band-stop filter circuit, a low-pass filter circuit, a band-pass filter circuit, and a high-pass filter circuit. The first band-stop filter circuit is coupled to the first port, and is configured to perform out-of-band suppression on a signal input from the first port and input a signal subjected to the out-of-band suppression to the low-pass filter circuit. The low-pass filter circuit is configured to input a first signal, a frequency of which is between a first frequency and a second frequency, of the signal input by the first band-stop filter circuit to the band-pass filter circuit.

16 Claims, 16 Drawing Sheets

(56)  References Cited

U.S. PATENT DOCUMENTS

| 2007/0021088 | A1 | 1/2007 | Sheng-Fuh et al. |
| 2012/0161907 | A1 | 6/2012 | Kawaguchi et al. |
| 2015/0304059 | A1 | 10/2015 | Zuo et al. |
| 2017/0237450 | A1 | 8/2017 | Knutson |
| 2024/0195388 | A1* | 6/2024 | Sung ..................... H03H 9/6483 |
| 2024/0304970 | A1* | 9/2024 | Mori ........................ H03H 7/09 |

* cited by examiner

A   First band-stop filter circuit — 10   Low-pass filter circuit — 20   Band-pass filter circuit — 30   High-pass filter circuit — 40   Second band-stop filter circuit — 50   B

50

C30

L12

Insertion loss

Frequency

FILTER, INTEGRATED PASSIVE DEVICE, ELECTRONIC DEVICE AND DISPLAY APPARATUS

CROSS REFERENCE TO RELATED APPLICATIONS

The present disclosure is a US National Stage of International Application No. PCT/CN 2022/126805, filed on Oct. 21, 2022, the entire contents of which are incorporated herein by reference.

TECHNICAL FIELD

The present disclosure relates to the field of electronics technology, and in particular to a filter, an integrated passive device, an electronic device and a display apparatus.

BACKGROUND

Filters have a very wide range of applications as essential and important constituent elements in the communication system.

There are many different types of traditional filters, including LC filters, cavity filters, etc. Cavity filters are large in size and are generally used in the field, such as base stations, etc. LC filters have a low degree of integration, commonly have large device sizes, are mainly used in the low frequency, and have poor filtering characteristics for high frequency signals.

SUMMARY

Embodiments of the present disclosure provide a filter applied in the field of radio frequency. The filter includes: a first port, a second port, a first band-stop filter circuit, a low-pass filter circuit, a band-pass filter circuit, and a high-pass filter circuit; the first band-stop filter circuit is coupled to the first port and is configured to perform out-of-band suppression on a signal input from the first port and input a signal subjected to the out-of-band suppression to the low-pass filter circuit;

the low-pass filter circuit is configured to input a first signal of the signal input by the first band-stop filter circuit to the band-pass filter circuit, wherein the first signal has a frequency between a first frequency and a second frequency;

the band-pass filter circuit is configured to input a second signal of the first signal input by the low-pass filter circuit to the high-pass filter circuit, wherein the second signal has a frequency between a third frequency and a fourth frequency; and the high-pass filter circuit is configured to pass through a third signal of the second signal input by the band-pass filter circuit, wherein the third signal has a frequency not less than the first frequency;

wherein the first frequency is less than the second frequency;

the third frequency is between the first frequency and the second frequency; and the fourth frequency is between the third frequency and the second frequency.

In some possible implementations, the filter further includes: a second band-stop filter circuit;

the high-pass filter circuit is coupled to the second port through the second band-stop filter circuit; and the second band-stop filter circuit is coupled to the second port, and is configured to perform out-of-band suppression on the third signal passed by the high-pass filter circuit and input a signal subjected to out-of-band suppression to the second port.

In some possible implementations, the band-pass filter circuit includes: a first capacitor, a second capacitor, a third capacitor, a fourth capacitor, a fifth capacitor, a sixth capacitor, a seventh capacitor, an eighth capacitor, a first inductor, a second inductor, and a ground terminal;

a first electrode of the first capacitor is coupled to the low-pass filter circuit, and a second electrode of the first capacitor is coupled to a first electrode of the second capacitor;

a second electrode of the second capacitor is coupled to a first electrode of the third capacitor;

a second electrode of the third capacitor is coupled to a first electrode of the fourth capacitor;

a second electrode of the fourth capacitor is coupled to the high-pass filter circuit;

a first electrode of the fifth capacitor is coupled to the first electrode of the third capacitor, and a second electrode of the fifth capacitor is coupled to a second electrode of the sixth capacitor;

a first electrode of the sixth capacitor is coupled to the second electrode of the third capacitor;

a first electrode of the seventh capacitor is coupled to the second electrode of the fifth capacitor, and a second electrode of the seventh capacitor is coupled to a first electrode of the eighth capacitor;

a second electrode of the eighth capacitor is coupled to the ground terminal;

a first electrode of the first inductor is coupled to the first electrode of the first capacitor, and a second electrode of the first inductor is coupled to the second electrode of the first capacitor; and a first electrode of the second inductor is coupled to the second electrode of the sixth capacitor, and a second electrode of the second inductor is coupled to the first electrode of the eighth capacitor.

In some possible implementations, the band-pass filter circuit includes: a ninth capacitor, a tenth capacitor, an eleventh capacitor, a twelfth capacitor, a thirteenth capacitor, a fourteenth capacitor, a third inductor, a fourth inductor, a fifth inductor, and a ground terminal;

a first electrode of the ninth capacitor is coupled to the low-pass filter circuit, and a second electrode of the ninth capacitor is coupled to a first electrode of the tenth capacitor;

a second electrode of the tenth capacitor is coupled to the high-pass filter circuit;

a first electrode of the eleventh capacitor is coupled to the first electrode of the ninth capacitor, and a second electrode of the eleventh capacitor is coupled to a first electrode of the twelfth capacitor;

a second electrode of the twelfth capacitor is coupled to the ground terminal;

a first electrode of the thirteenth capacitor is coupled to the second electrode of the ninth capacitor, and a second electrode of the thirteenth capacitor is coupled to a first electrode of the fourteenth capacitor;

a second electrode of the fourteenth capacitor is coupled to the ground terminal;

a first electrode of the third inductor is coupled to the first electrode of the twelfth capacitor, and a second electrode of the third inductor is coupled to the second electrode of the twelfth capacitor;

a first electrode of the fourth inductor is coupled to the first electrode of the fourteenth capacitor, and a second electrode of the fourth inductor is coupled to the second electrode of the fourteenth capacitor; and a first electrode of the fifth inductor is coupled to the first electrode of the tenth capacitor, and a second electrode of the fifth inductor is coupled to the second electrode of the tenth capacitor.

In some possible implementations, the band-pass filter circuit includes: a fifteenth capacitor, a sixteenth capacitor, a seventeenth capacitor, an eighteenth capacitor, a nineteenth capacitor, a twentieth capacitor, a twenty-first capacitor, a twenty-second capacitor, a twenty-third capacitor, a twenty-fourth capacitor, a twenty-fifth capacitor, a twenty-sixth capacitor, a twenty-seventh capacitor, a twenty-eighth capacitor, a sixth inductor, a seventh inductor, an eighth inductor, a ninth inductor, a tenth inductor, and a ground terminal;

a first electrode of the fifteenth capacitor is coupled to the low-pass filter circuit, and a second electrode of the fifteenth capacitor is coupled to a first electrode of the sixteenth capacitor;

a second electrode of the sixteenth capacitor is coupled to a first electrode of the seventeenth capacitor;

a second electrode of the seventeenth capacitor is coupled to a first electrode of the eighteenth capacitor;

a second electrode of the eighteenth capacitor is coupled to a first electrode of the nineteenth capacitor;

a second electrode of the nineteenth capacitor is coupled to a first electrode of the twentieth capacitor a second electrode of the twentieth capacitor is coupled to the high-pass filter circuit;

a first electrode of the twenty-first capacitor is coupled to the first electrode of the seventeenth capacitor, and a second electrode of the twenty-first capacitor is coupled to a second electrode of the twenty-second capacitor;

a first electrode of the twenty-second capacitor is coupled to the second electrode of the seventeenth capacitor;

a first electrode of the twenty-third capacitor is coupled to the second electrode of the twenty-first capacitor, and a second electrode of the twenty-third capacitor is coupled to a first electrode of the twenty-fourth capacitor;

a second electrode of the twenty-fourth capacitor is coupled to the ground terminal;

a first electrode of the twenty-fifth capacitor is coupled to the second electrode of the eighteenth capacitor, and a second electrode of the twenty-fifth capacitor is coupled to a first electrode of the twenty-sixth capacitor;

a second electrode of the twenty-sixth capacitor is coupled to the ground terminal;

a first electrode of the twenty-seventh capacitor is coupled to the second electrode of the nineteenth capacitor, and a second electrode of the twenty-seventh capacitor is coupled to a first electrode of the twenty-eighth capacitor;

a second electrode of the twenty-eighth capacitor is coupled to the ground terminal;

a first electrode of the sixth inductor is coupled to the first electrode of the fifteenth capacitor, and a second electrode of the sixth inductor is coupled to the second electrode of the fifteenth capacitor;

a first electrode of the seventh inductor is coupled to the second electrode of the twenty-second capacitor, and a second electrode of the seventh inductor is coupled to the first electrode of the twenty-fourth capacitor;

a first electrode of the eighth inductor is coupled to the first electrode of the twenty-sixth capacitor, and a second electrode of the eighth inductor is coupled to the second electrode of the twenty-sixth capacitor;

a first electrode of the ninth inductor is coupled to the first electrode of the twenty-eighth capacitor, and a second electrode of the ninth inductor is coupled to the second electrode of the twenty-eighth capacitor; and a first electrode of the tenth inductor is coupled to the first electrode of the twentieth capacitor, and a second electrode of the tenth inductor is coupled to the second electrode of the twentieth capacitor.

In some possible implementations, the first band-stop filter circuit includes: a twenty-ninth capacitor, and an eleventh inductor;

a first electrode of the twenty-ninth capacitor is coupled to the first port, and a second electrode of the twenty-ninth capacitor is coupled to the low-pass filter circuit; and a first electrode of the eleventh inductor coupled to the first electrode of the twenty-ninth capacitor, and the second electrode of the eleventh inductor coupled to the second electrode of the twenty-ninth capacitor.

In some possible implementations, the second band-stop filter circuit includes: a thirtieth capacitor, and a twelfth inductor;

a first electrode of the thirtieth capacitor is coupled to the high-pass filter circuit, and a second electrode of the thirtieth capacitor is coupled to the second port; and a first electrode of the twelfth inductor coupled to a first electrode of the thirtieth capacitor, and a second electrode of the twelfth inductor coupled to the second electrode of the thirtieth capacitor.

In some possible implementations, the low-pass filter circuit includes: a thirty-first capacitor, a thirty-second capacitor, a thirty-third capacitor, a thirty-fourth capacitor, a thirty-fifth capacitor, a thirty-sixth capacitor, a thirty-seventh capacitor, a thirteenth inductor, and a ground terminal;

a first electrode of the thirty-first capacitor is coupled to the first band-stop filter circuit, and a second electrode of the thirty-first capacitor is coupled to a first electrode of the thirty-second capacitor;

a second electrode of the thirty-second capacitor is coupled to a first electrode of the thirty-third capacitor;

a second electrode of the thirty-third capacitor is coupled to the band-pass filter circuit;

a first electrode of the thirty-fourth capacitor is coupled to the first electrode of the thirty-second capacitor, and a second electrode of the thirty-fourth capacitor is coupled to a second electrode of the thirty-fifth capacitor;

a first electrode of the thirty-fifth capacitor is coupled to the second electrode of the thirty-second capacitor;

a first electrode of the thirty-sixth capacitor is coupled to the second electrode of the thirty-fourth capacitor, and a second electrode of the thirty-sixth capacitor is coupled to a first electrode of the thirty-seventh capacitor;

a second electrode of the thirty-seventh capacitor is coupled to the ground terminal; and a first electrode of the thirteenth inductor is coupled to the second electrode of the thirty-fifth capacitor, and a second electrode of the thirteenth inductor is coupled to the first electrode of the thirty-seventh capacitor.

In some possible implementations, the high-pass filter circuit includes: a thirty-eighth capacitor, a thirty-ninth capacitor, a fortieth capacitor, a forty-first capacitor, a forty-second capacitor, a fourteenth inductor, a fifteenth inductor, and a ground terminal;

a first electrode of the thirty-eighth capacitor is coupled to the band-pass filter circuit, and a second electrode of the thirty-eighth capacitor is coupled to the second band-stop filter circuit;

a first electrode of the thirty-ninth capacitor is coupled to the first electrode of the thirty-eighth capacitor, and a second electrode of the thirty-ninth capacitor is coupled to a first electrode of the fortieth capacitor;

a second electrode of the fortieth capacitor is coupled to the ground terminal;

a first electrode of the forty-first capacitor is coupled to the second electrode of the thirty-eighth capacitor, and a second electrode of the forty-first capacitor is coupled to a first electrode of the forty-second capacitor;

a second electrode of the forty-second capacitor is coupled to the ground terminal;

a first electrode of the fourteenth inductor is coupled to the first electrode of the fortieth capacitor, and a second electrode of the fourteenth inductor is coupled to the second electrode of the fortieth capacitor; and a first electrode of the fifteenth inductor is coupled to the first electrode of the forty-second capacitor, and a second electrode of the fifteenth inductor is coupled to the second electrode of the forty-second capacitor.

In some possible implementations, a capacitance value of each of the capacitors in the filter is in the range of 0.1-10 pF.

In some possible implementations, an inductor value of the inductor in each of the filters is in the range of 0.1-10 nH.

In some possible implementations, the filter is formed on a glass substrate.

In some possible implementations, the filter is a high frequency filter.

Embodiments of the present disclosure provide an integrated passive device including the filter described above.

Embodiments of the present disclosure provide an electronic device including the integrated passive device described above.

Embodiments of the present disclosure provide a display apparatus including the electronic device described above.

6

Figure 8:
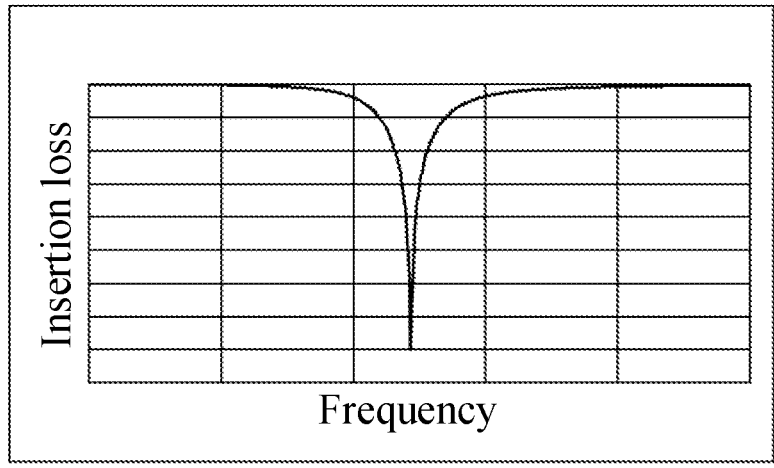

FIG. 8 shows a schematic diagram of a result of yet some other simulations provided by embodiments of the present disclosure.

Figure 9:
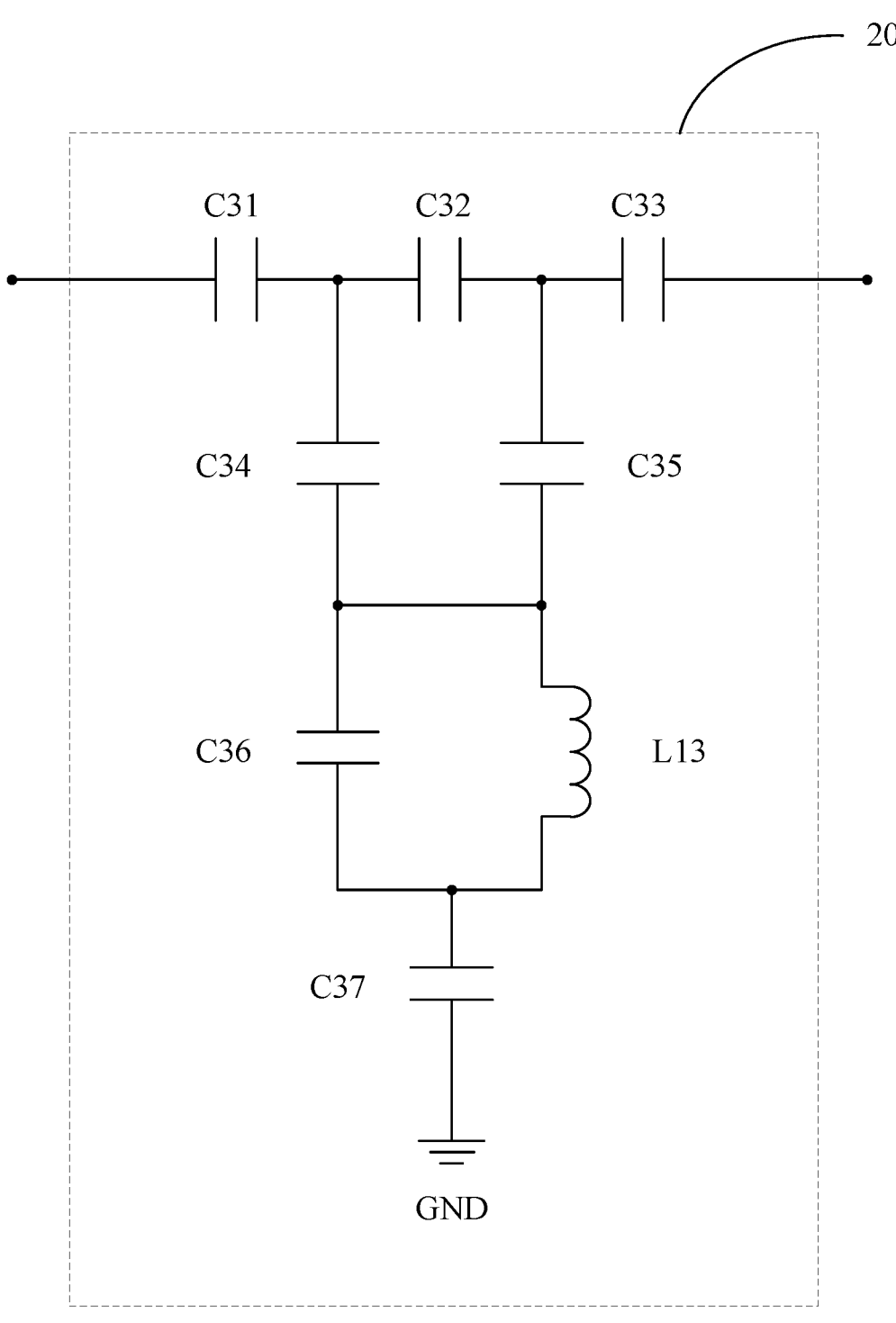

FIG. 9 shows a schematic diagram of yet some other structures of a filter provided by embodiments of the present disclosure.

Figure 10:
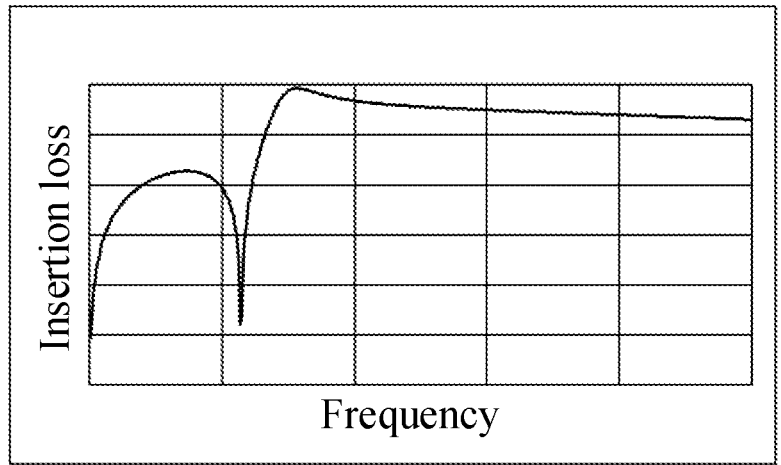

FIG. 10 shows a schematic diagram of a result of yet some other simulations provided by embodiments of the present disclosure.

Figure 11:
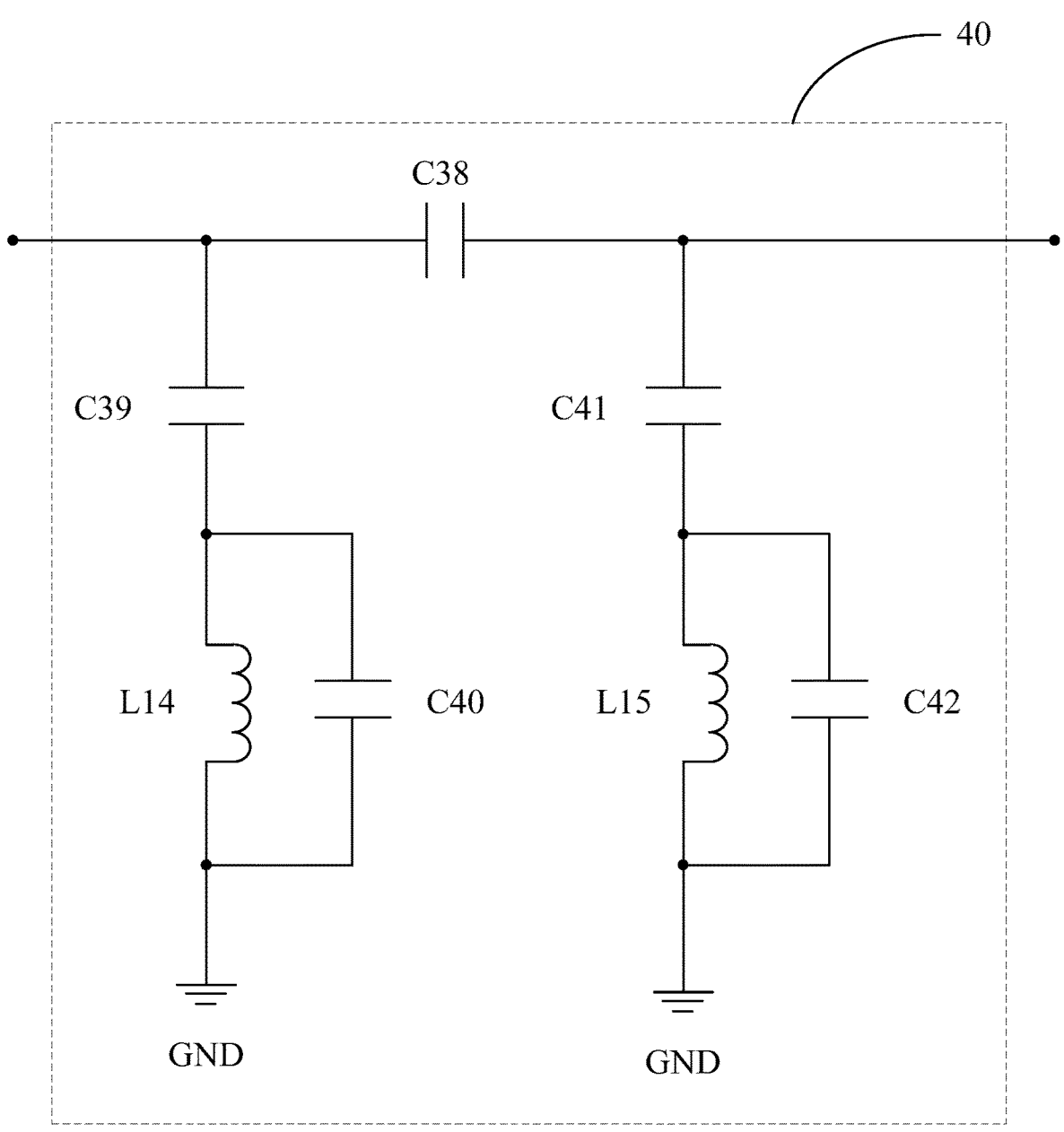

FIG. 11 shows a schematic diagram of yet some other structures of a filter provided by embodiments of the present disclosure.

Figure 12:
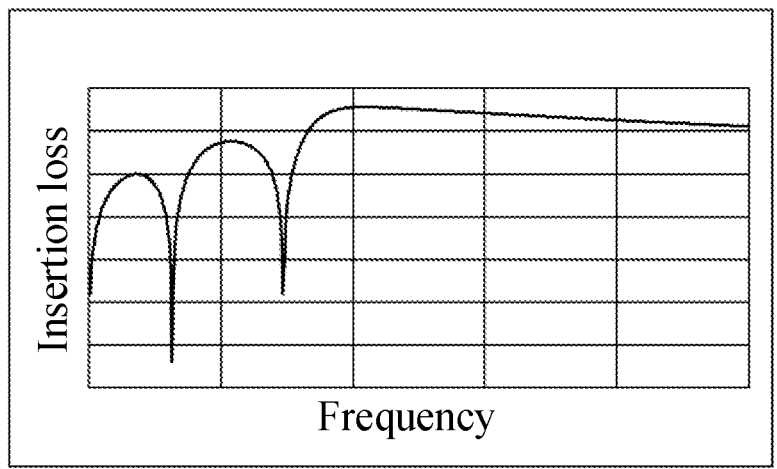

FIG. 12 shows a schematic diagram of a result of yet some other simulations provided by embodiments of the present disclosure.

Figure 13:
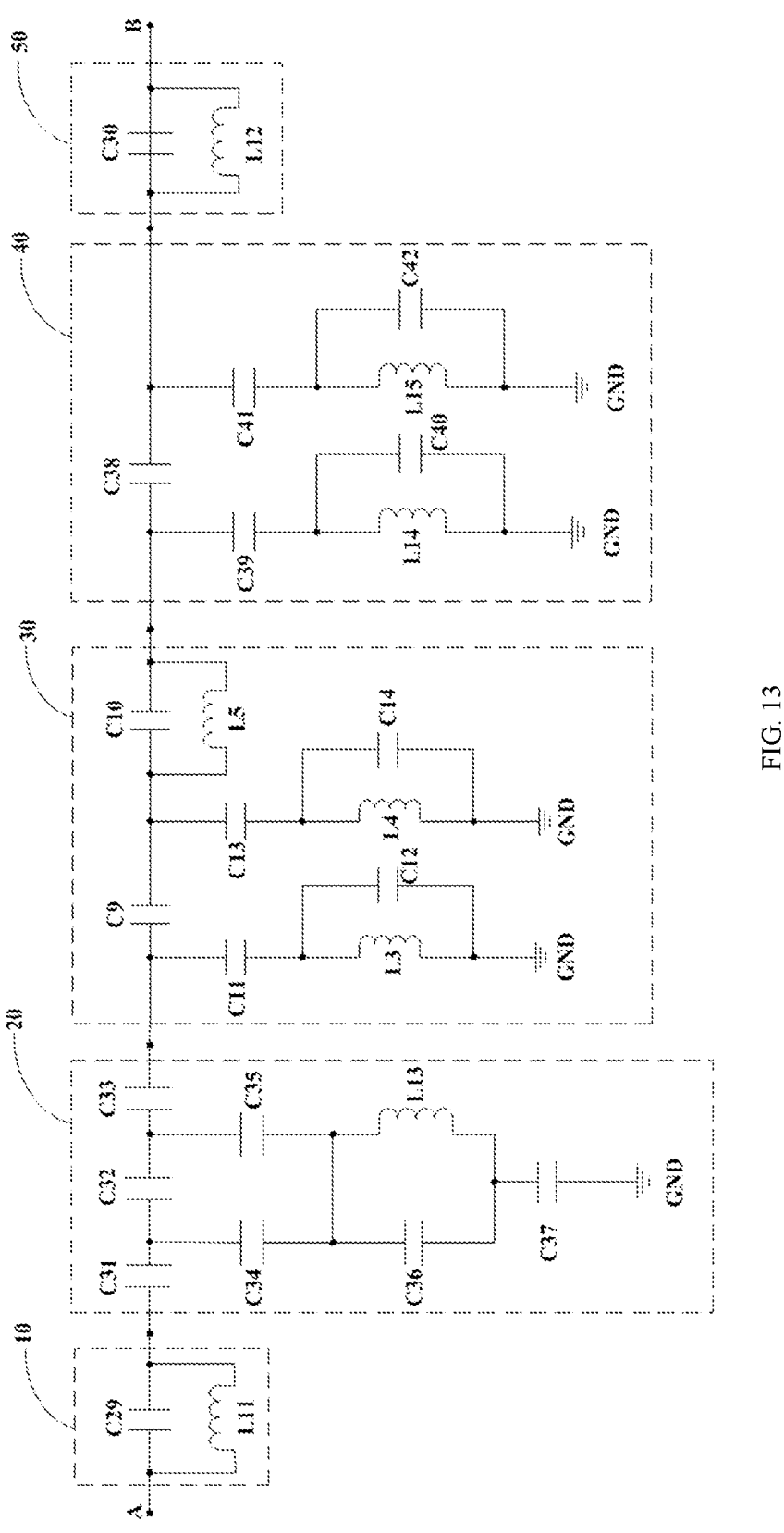

FIG. 13 shows a schematic diagram of yet some other structures of a filter provided by embodiments of the present disclosure.

Figure 14:
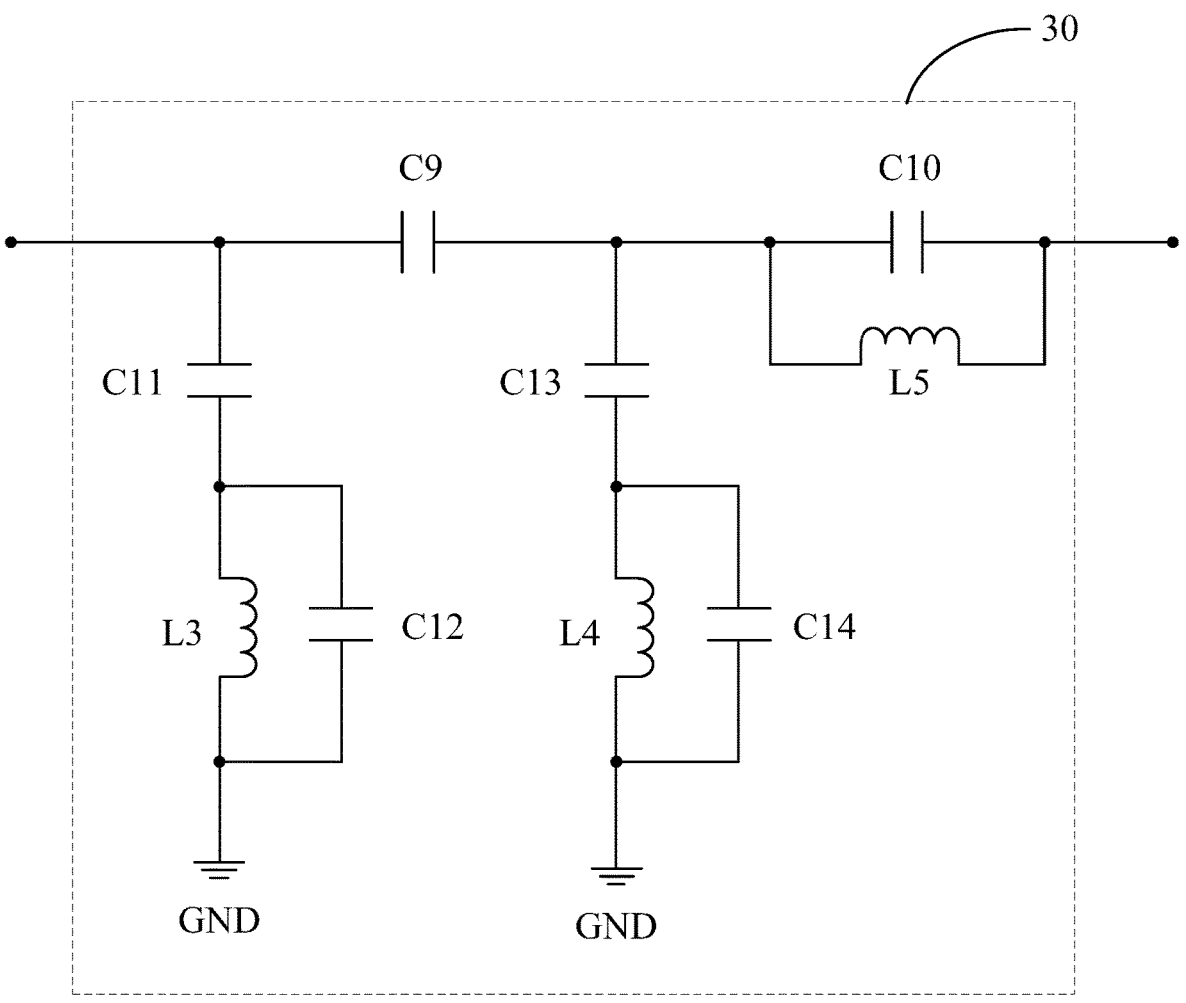

FIG. 14 shows a schematic diagram of yet some other structures of a filter provided by embodiments of the present disclosure.

Figure 15:
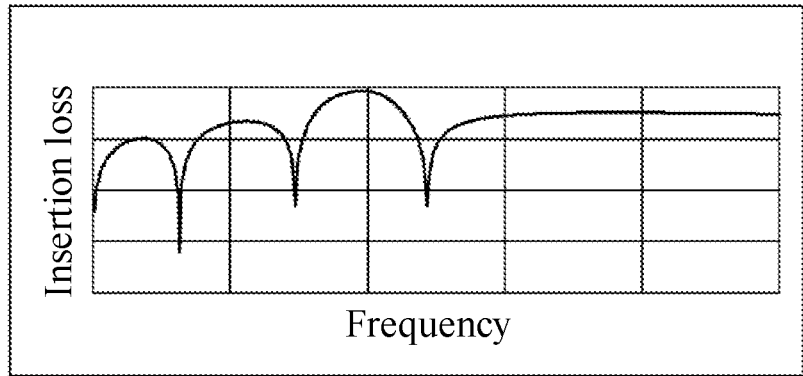

FIG. 15 shows a schematic diagram of yet some other simulation results provided by embodiments of the present disclosure.

Figure 16:
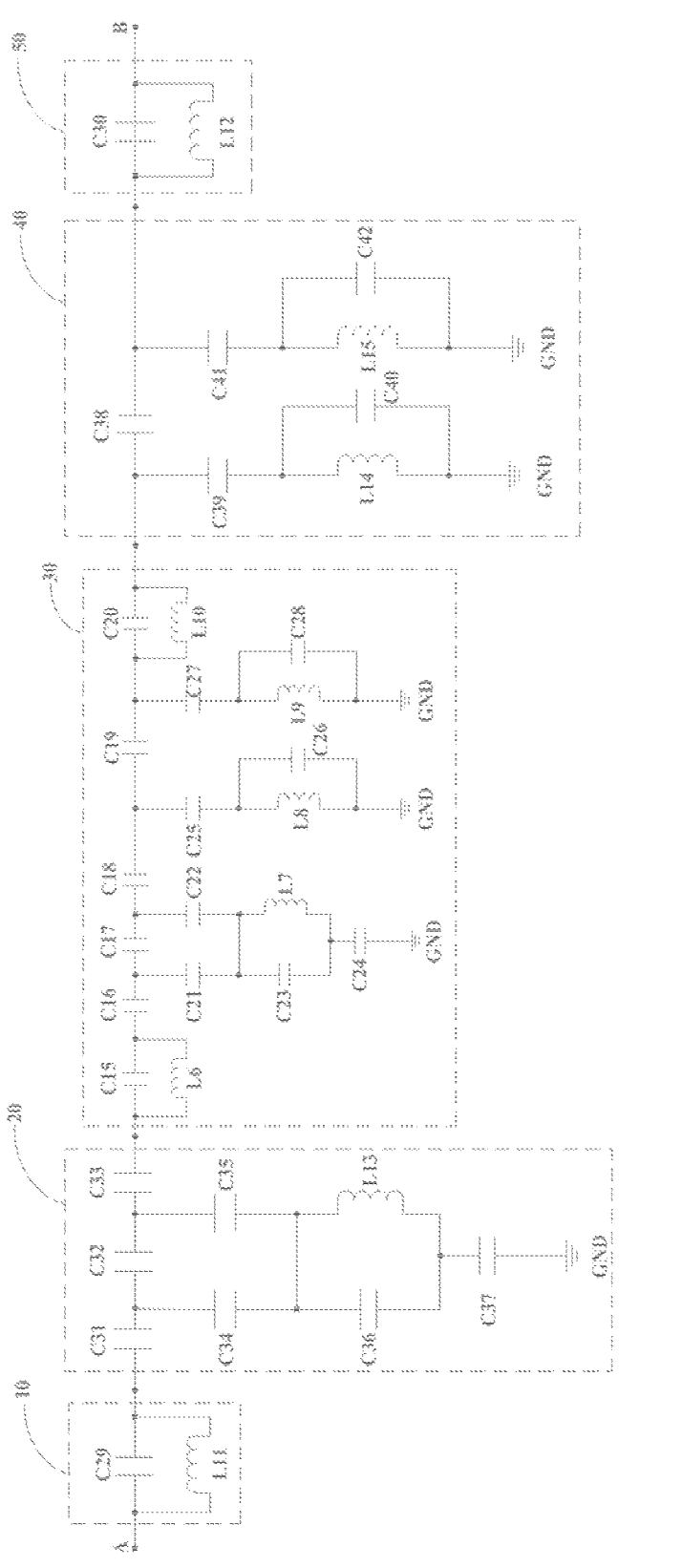

FIG. 16 shows a schematic diagram of yet some other structures of a filter provided by embodiments of the present disclosure.

Figure 17:
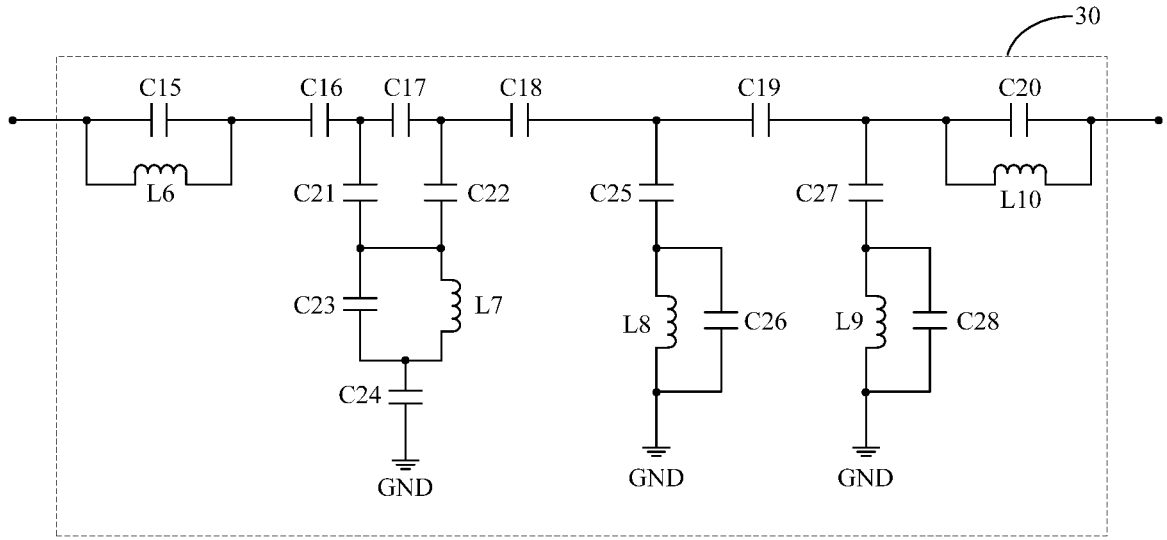

FIG. 17 shows a schematic diagram of yet some other structures of a filter provided by embodiments of the present disclosure.

Figure 18:
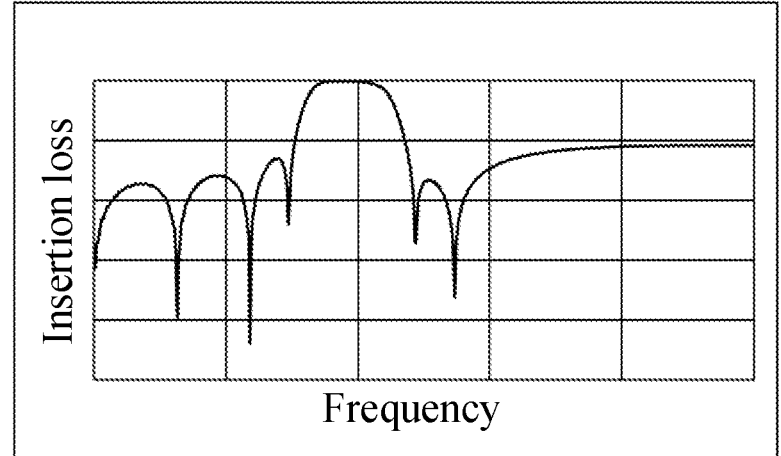

FIG. 18 shows a schematic diagram of a result of yet some other simulations provided by embodiments of the present disclosure.

DETAILED DESCRIPTION

In order to make the objects, technical solutions and advantages of the embodiments of the present disclosure clearer, the technical solutions of the embodiments of the present disclosure will be described clearly and completely in the following in conjunction with the accompanying drawings of the embodiments of the present disclosure. Obviously, the described embodiments are a part of the embodiments of the present disclosure and not all of the embodiments. Additionally, the embodiments and the features in the embodiments of the present disclosure can be combined with each other without conflict. Based on the described embodiments of the present disclosure, all other embodiments obtained by a person of ordinary skill in the art without the need for creative labor are within the protection scope of the present disclosure.

Unless otherwise defined, technical or scientific terms used in the present disclosure shall have the ordinary meaning understood by a person of ordinary skill in the field to which the present disclosure belongs. The terms "first", "second", and the like as used in the present disclosure do not indicate any order, number, or significance, but are only used to distinguish different components. The words "including" or "comprising" and the like are intended to mean that the component or object preceded by the word encompasses the components or objects listed after the word and their equivalents, and does not exclude other components or objects. Words such as "connected" or "coupled" are not limited to physical or mechanical connections, but may include electrical connections, whether direct or indirect.

It should be noted that the dimensions and shapes of the figures in the accompanying drawings do not reflect true proportions, but are intended to be illustrative of the invention only. Additionally, throughout the same or similar labeling denotes the same or similar elements or elements having the same or similar function.

With the development of the country's technology for aerospace, national defense technology, satellite remote sensing and radar communication, the communication technology has been developed rapidly, and the requirements for the performance, volume, reliability, etc., of the microwave radio frequency device are becoming increasingly stringent. In addition, due to the rapid popularization of 5G technology, the use of high-speed signals in daily life and industry has also been significantly increased. Therefore, the development of high-speed signal electronic devices has become the core of communication technology development.

The communication system includes many common radio frequency (RF) structures, such as filters, baluns, duplexers, switches, etc. These structures are generally used to complete the system through a printed circuit board (PCB) with external circuits and discrete capacitors and inductors. These devices and circuit structures occupy most of the area of the PCB structure, more than 50%, which seriously affects the development of communication system miniaturization.

The filters as essential and important components of the communication system have a very wide range of applications. There are many different types of traditional filters, including LC filters, cavity filters, etc. Cavity filters are large in size and are generally used in the field, such as base stations, etc. While the filtering functions of the LC filters can be realized by arranging different numbers of inductors, capacitors and resistors according to the circuit design, and the LC filters can be used in some small electronic devices. However, LC filters composed of traditional discrete devices have a low degree of integration, commonly have large device sizes, are mainly used in the low frequency, and have poor filtering characteristics for high frequency signals. The technical indicators of the filter in use include a pass-band frequency band, a bandwidth, an insertion loss, out-of-band suppression, etc. In the 5G era, the communication technology with large bandwidth, low loss, and fast out-of-band attenuation are the core goal of development.

The filter provided in the present disclosure is an LC filter, which effectively realizes characteristics of low insertion loss in the pass-band, fast attenuation at the band edges, multiple transmission zeros, and better out-of-band suppression by combining a band-stop filter circuit, a low-pass filter circuit, a band-pass filter circuit, and a high-pass filter circuit with each other. In addition, the circuit design of the present disclosure can be applied in the field of integrated passive technology, effectively realizing the goal of miniaturization and low cost of the filter.

Figure 1:
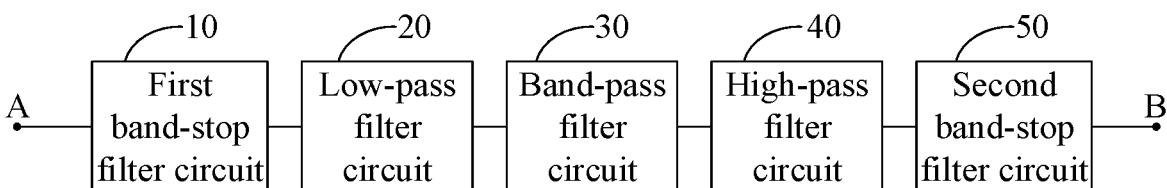
FIG. 1 shows a schematic diagram of some structures of a filter provided by embodiments of the present disclosure.

Embodiments of the present disclosure provide a filter, and the filter is applied in the field of radio frequency. As shown in FIG. 1, the filter includes: a first port A, a second port B, a first band-stop filter circuit 10, a low-pass filter circuit 20, a band-pass filter circuit 30, and a high-pass filter circuit 40. Herein, the first band-stop filter circuit 10 is coupled to the first port A, and the first band-stop filter circuit 10 is configured to perform out-of-band suppression on a signal input from the first port A and input a signal subjected to the out-of-band suppression to the low-pass filter circuit 20. The low-pass filter circuit 20 is configured to input a first signal of the signal input by the first band-stop filter circuit 10 to the band-pass filter circuit 30, wherein the first signal has a frequency between the first frequency and the second frequency. The band-pass filter circuit 30 is configured to input a second signal of the first signal input by the low-pass filter circuit 20 to the high-pass filter circuit 40, wherein the second signal has a frequency between the third frequency and the fourth frequency. The high-pass filter circuit 40 is configured to pass through a third signal of the second signal input by the band-pass filter circuit 30, wherein the third signal has a frequency not less than the first frequency. Herein, the first frequency is less than the second frequency. A third frequency is between the first frequency and the second frequency; and the fourth frequency is between the third frequency and the second frequency.

In embodiments of the present disclosure, by the coordination of the first port, the second port, the first band-stop filter circuit, the low-pass filter circuit, the band-pass filter circuit, and the high-pass filter circuit, the quantity of transmission zeros are increased, the effect of out-of-band suppression is improved, and the filter with multiple transmission zeros, a large bandwidth, a high roll-off characteristic, and high out-of-band suppression is formed.

In embodiments of the present disclosure, as shown in FIG. 1, the filter further includes: a second band-stop filter circuit 50. Here, the high-pass filter circuit 40 is coupled to the second port B via the second band-stop filter circuit 50. The second band-stop filter circuit 50 is coupled to the second port B. The second band-stop filter circuit 50 is configured to perform out-of-band suppression on the third signal passed by the high-pass filter circuit 40 and input a signal subjected to out-of-band suppression to the second port.

In embodiments of the present disclosure, by the coordination of the first port, the second port, the first band-stop filter circuit, the low-pass filter circuit, the band-pass filter circuit, the high-pass filter circuit, and the second band-stop filter circuit, the quantity of transmission zeros are increased, the effect of out-of-band suppression is improved, and effective filtering for clutter signals and secondary harmonic signals is realized. Thereby, the filter having multiple transmission zeros, a large bandwidth, a high roll-off characteristic, and high out-of-band suppression is formed.

As well, in the present disclosure, the out-of-band suppression is optimized and the transmission zeros are increased by incorporating the first band-stop filter circuit and the second band-stop filter circuit; the filter circuit with a large bandwidth is realized by combining the high-pass filter circuit and the low-pass filter circuit; and a high flatness in the band-pass frequency band is ensured by the combination of multiple band-pass filter circuits, so as to form a fast signal attenuation on both sides of the pass band and improve the roll-off characteristics.

In addition, the band-pass filter circuit designed in the present disclosure can satisfy the application of integrated passive technology, and the RF filter prepared by the integrated passive technology is conducive to realize a small area layout design, which ensures the high performance, low cost, and miniaturization of the filter.

Figure 2:
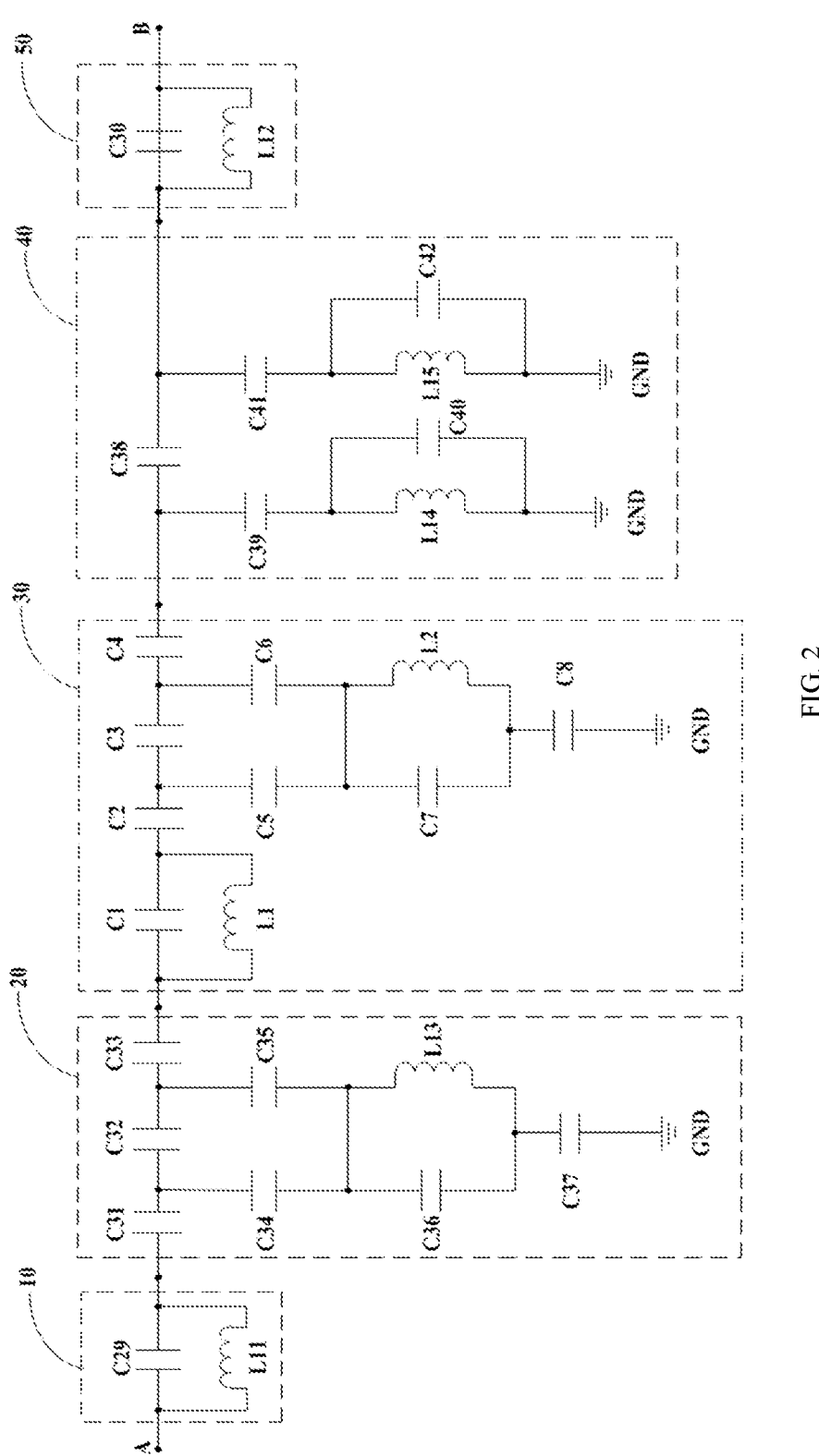
FIG. 2 shows a schematic diagram of some other structures of a filter provided by embodiments of the present disclosure.
Figure 3:
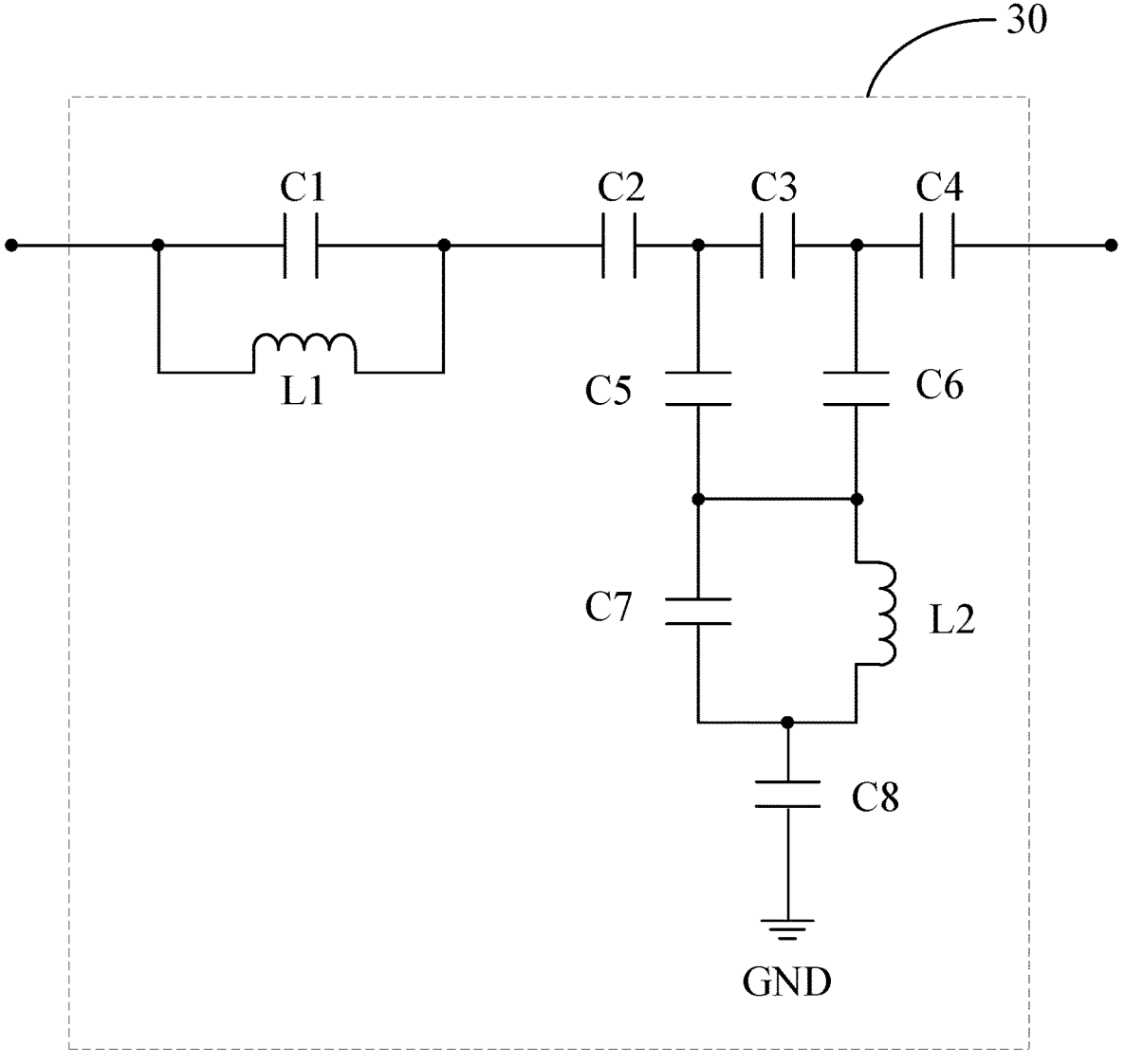
FIG. 3 shows a schematic diagram of yet some other structures of a filter provided by embodiments of the present disclosure.

In embodiments of the present disclosure, as shown in FIGS. 2 and 3, the band-pass filter circuit 30 includes: a first capacitor C1, a second capacitor C2, a third capacitor C3, a fourth capacitor C4, a fifth capacitor C5, a sixth capacitor C6, a seventh capacitor C7, an eighth capacitor C8, a first inductor L1, a second inductor L2, and a ground terminal GND. A first electrode of the first capacitor C1 is coupled to the low-pass filter circuit 20, and a second electrode of the first capacitor C1 is coupled to a first electrode of the second capacitor C2. A second electrode of the second capacitor C2 is coupled to a first electrode of the third capacitor C3. A second electrode of the third capacitor C3 is coupled to a first electrode of the fourth capacitor C4. A second electrode of the fourth capacitor C4 is coupled to the high-pass filter circuit 40. A first electrode of the fifth capacitor C5 is coupled to the first electrode of the third capacitor C3, and a second electrode of the fifth capacitor C5 is coupled to a second electrode of the sixth capacitor C6. A first electrode of the sixth capacitor C6 is coupled to the second electrode of the third capacitor. A first electrode of the seventh capacitor C7 is coupled to the second electrode of the fifth capacitor C5, and a second electrode of the seventh capacitor C7 is coupled to a first electrode of the eighth capacitor C8. A second electrode of the eighth capacitor C8 is coupled to the ground terminal GND. A first electrode of the first inductor L1 is coupled to the first electrode of the first capacitor C1, and a second electrode of the first inductor L1 is coupled to the second electrode of the first capacitor C1. A first electrode of the second inductor L2 is coupled to the second electrode of the sixth capacitor C6, and a second electrode of the second inductor L2 is coupled to the first electrode of the eighth capacitor C8.

Here, by the combination of the first capacitor C1, the second capacitor C2, the third capacitor C3, the fourth capacitor C4, the fifth capacitor C5, the sixth capacitor C6, the seventh capacitor C7, the eighth capacitor C8, the first inductor L1, and the second inductor L2, so as to filter a first signal(s) whose frequency is outside the third frequency and the fourth frequency from the first signals input by the low-pass filter circuit 20, retain a first signal(s) whose frequency is between the third frequency and the fourth frequency, and input the retained first signal(s) as a second signal(s) into the high-pass filter circuit 40.

Figure 4:
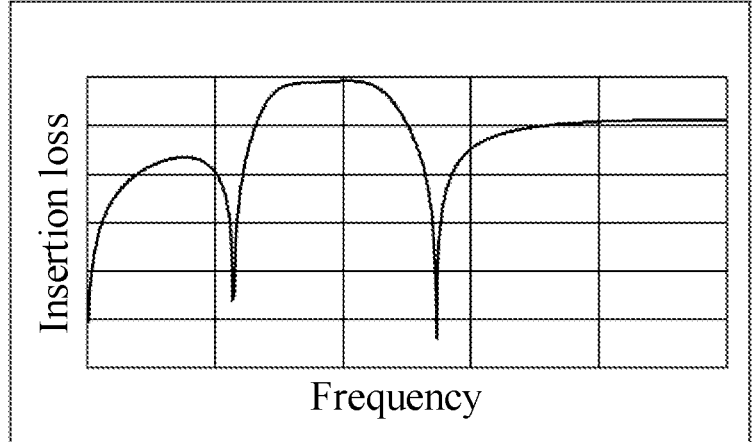
FIG. 4 shows a schematic diagram of a result of some simulations provided by embodiments of the present disclosure.

In embodiments of the present disclosure, the band-pass filter circuit 30 is also simulated, and a schematic diagram of a result of simulation is as shown in FIG. 4. Here, the horizontal coordinate is the frequency and the vertical coordinate is the insertion loss. As can be seen in FIG. 3, the band-pass filter circuit 30 can form a band-pass filter circuit with a large bandwidth, and also has a certain effect of out-of-band suppression.

Figure 5:
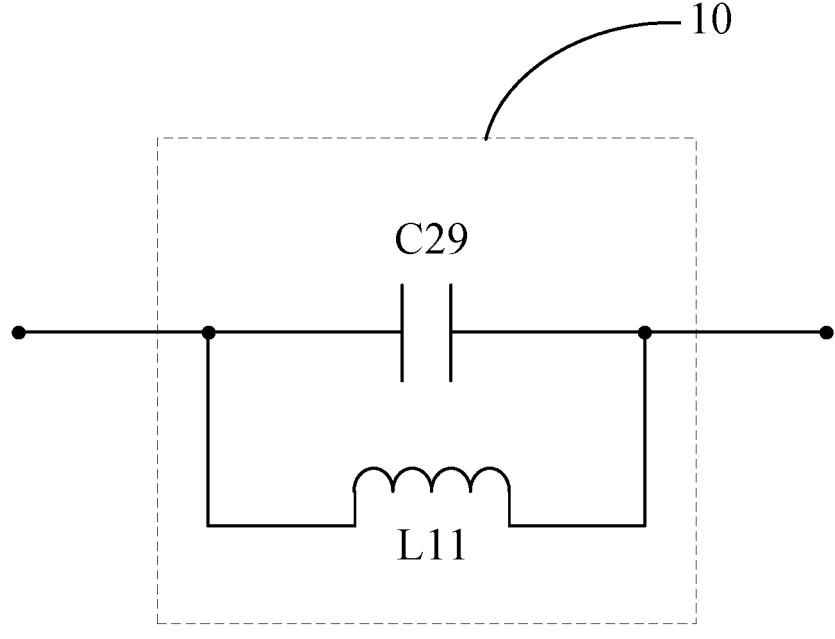
FIG. 5 shows a schematic diagram of yet some other structures of a filter provided by embodiments of the present disclosure.

In embodiments of the present disclosure, as shown in FIGS. 2 and 5, the first band-stop filter circuit 10 includes: a twenty-ninth capacitor C29 and an eleventh inductor L11. Here, a first electrode of the twenty-ninth capacitor C29 is coupled to the first port A, and a second electrode of the twenty-ninth capacitor C29 is coupled to the low-pass filter circuit 20. A first electrode of the eleventh inductor L11 is coupled to a first electrode of the twenty-ninth capacitor C29, and a second electrode of the eleventh inductor L11 is coupled to the second electrode of the twenty-ninth capacitor C29.

Here, the twenty-ninth capacitor C29 and the eleventh inductor L11 are combined with each other so as to first perform out-of-band suppression on the signal input by the first port A, and then input the signal subjected to the out-of-band suppression into the low-pass filter circuit 20.

Figure 6:
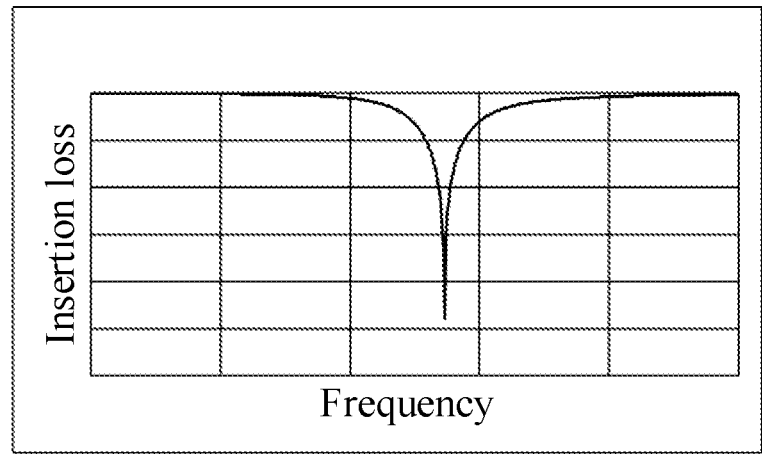
FIG. 6 shows a schematic diagram of a result of some other simulations provided by embodiments of the present disclosure.

In embodiments of the present disclosure, the first band-stop filter circuit 10 is also simulated, and a schematic diagram of a result of simulation is as shown in FIG. 6, from which it can be seen that the first band-stop filter circuit 10 can generate an additional transmission zero(s) in the out-of-band frequency range. The transmission zero(s) can effectively increase the insertion loss at the frequency portion out of the pass-band. Through the increased quantity of transmission zeros, the problem of the curve of the out-ofband resonant portion falling too slowly is solved, and the out-of-band suppression of the overall circuit is improved.

Figure 7:
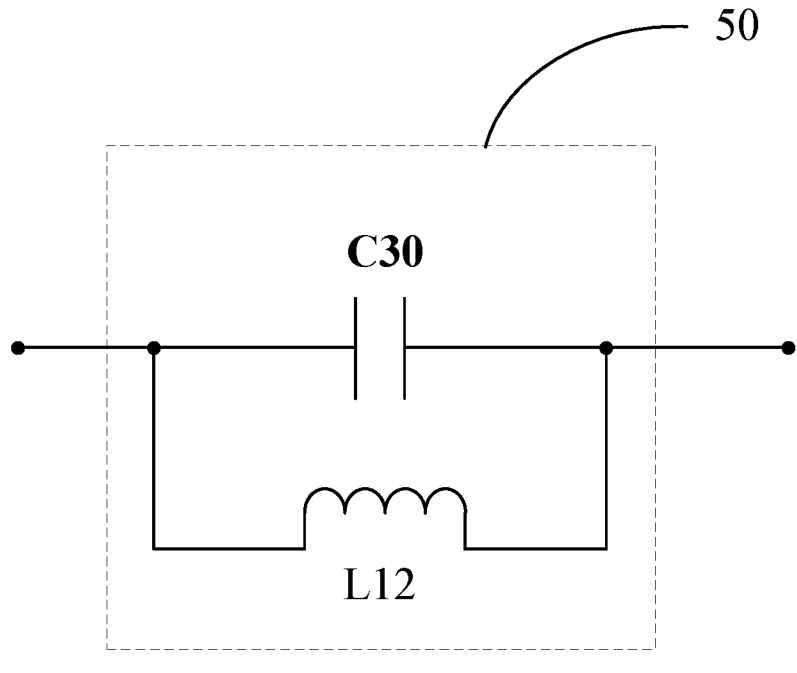
FIG. 7 shows a schematic diagram of yet some other structures of a filter provided by embodiments of the present disclosure.

In embodiments of the present disclosure, as shown in FIGS. 2 and 7, the second band-stop filter circuit 50 includes: a thirtieth capacitor C30, and a twelfth inductor L12. Here, a first electrode of the thirtieth capacitor C30 is coupled to the high-pass filter circuit 40, and a second electrode of the thirtieth capacitor C30 is coupled to the second port B. A first electrode of the twelfth inductor L12 is coupled to a first electrode of the thirtieth capacitor C30, and a second electrode of the twelfth inductor L12 is coupled to the second electrode of the thirtieth capacitor C30.

Here, the thirtieth capacitor C30 and the twelfth inductor L12 are combined with each other, so as to first perform out-of-band suppression on the third signal input by the high-pass filter circuit 40, and then input the third signal subjected to out-of-band suppression into the second port B.

In embodiments of the present disclosure, the band-pass filter circuit 30 is also simulated, and a schematic diagram of a result of simulation is as shown in FIG. 8, from which it can be seen that the second band-stop filter circuit 50 can generate additional transmission zeros in the out-of-band frequency range, which solves the problem of the curve of the out-of-band resonant portion falling too slowly, and improves the out-of-band suppression of the overall circuit.

In embodiments of the present disclosure, as shown in FIGS. 2 and 9, the low-pass filter circuit 20 includes: a thirty-first capacitor C31, a thirty-second capacitor C32, a thirty-third capacitor C33, a thirty-fourth capacitor C34, a thirty-fifth capacitor C35, a thirty-sixth capacitor C36, a thirty-seventh capacitor C37, a thirteenth inductor L13, and a ground terminal GND. Herein, a first electrode of the thirty-first capacitor C31 is coupled to the first band-stop filter circuit 10, the second electrode of the thirty-first capacitor C31 is coupled to a first electrode of the thirty-second capacitor C32. A second electrode of the thirty-second capacitor C32 is coupled to a first electrode of the thirty-third capacitor 33. A second electrode of the thirty-third capacitor C33 is coupled to the band-pass filter circuit 30. A first electrode of the thirty-fourth capacitor C34 is coupled to the first electrode of the thirty-second capacitor C32, and a second electrode of the thirty-fourth capacitor C34 is coupled to a second electrode of the thirty-fifth capacitor C35. A first electrode of the thirty-fifth capacitor C35 is coupled to the second electrode of the thirty-second capacitor C32. A first electrode of the thirty-sixth capacitor C36 is coupled to the second electrode of the thirty-fourth capacitor C34, and a second electrode of the thirty-sixth capacitor C36 is coupled to a first electrode of the thirty-seventh capacitor C37. A second electrode of the thirty-seventh capacitor C37 is coupled to the ground terminal GND. A first electrode of the thirteenth inductor L13 is coupled to the second electrode of the thirty-fifth capacitor C35, and a second electrode of the thirteenth inductor L13 is coupled to the first electrode of the thirty-seventh capacitor C37.

Herein, the first electrode of the thirty-first capacitor C31 in the low-pass filter circuit 20 is coupled to the second electrode of the twenty-ninth capacitor C29 in the first band-stop filter circuit 10, and the second electrode of the thirty-third capacitor C33 in the low-pass filter circuit 20 is coupled to the first electrode of the first capacitor C1 in the band-pass filter circuit 30.

Exemplarily, the thirty-first capacitor C31, the thirty-second capacitor C32, the thirty-third capacitor C33, the thirty-fourth capacitor C34, the thirty-fifth capacitor C35, the thirty-sixth capacitor C36, the thirty-seventh capacitor C37, and the thirteenth inductor L13 are combined with each other, so as to filter the signal(s), the frequency of which is not between the first frequency and the second frequency, among the signals input by the first band-stop filter circuit 10, retain the signal(s), the frequency of which is between the first frequency and the second frequency, among the signals input by the first band-stop filter circuit 10, and input the retained signal(s) as the first signal(s) into the band-pass filter circuit 30.

In the embodiments of the present disclosure, the low-pass filter circuit 20 is also simulated, and a schematic diagram of a result of simulation is as shown in FIG. 10, from which it can be seen that the low-pass filter circuit can be formed by the formation of this impedance matching network, has an excellent roll-off characteristic at the edges of the pass-band, and simultaneously ensures a certain suppression effect in the low-frequency range.

In embodiments of the present disclosure, as shown in FIGS. 2 and 11, the high-pass filter circuit 40 includes: a thirty-eighth capacitor C38, a thirty-ninth capacitor C39, a fortieth capacitor C40, a forty-first capacitor C41, a forty-second capacitor C42, a fourteenth inductor L14, a fifteenth inductor L15, and a ground terminal GND. Herein, a first electrode of the thirty-eighth capacitor C38 is coupled to the band-pass filter circuit 30, and a second electrode of the thirty-eighth capacitor C38 is coupled to the second band-stop filter circuit 50. A first electrode of the thirty-ninth capacitor C39 is coupled to the first electrode of the thirty-eighth capacitor C38, and a second electrode of the thirty-ninth capacitor C39 is coupled to a first electrode of the fortieth capacitor C40. A second electrode of the fortieth capacitor C40 is coupled to the ground terminal GND. A first electrode of the forty-first capacitor C41 electrode is coupled to the second electrode of the thirty-eighth capacitor C38, and a second electrode of the forty-first capacitor C41 is coupled to a first electrode of the forty-second capacitor C42. A second electrode of the forty-second capacitor C42 is coupled to the ground terminal GND. A first electrode of the fourteenth inductor L14 is coupled to the first electrode of the fortieth capacitor C40, and a second electrode of the fourteenth inductor L14 is coupled to the second electrode of the fortieth capacitor C40. A first electrode of the fifteenth inductor L15 is coupled to the first electrode of the forty-second capacitor C42, and the second electrode of the fifteenth inductor L15 is coupled to the second electrode of the forty-second capacitor C42.

Herein, the first electrode of the thirty-eighth capacitor C38 in the high-pass filter circuit 40 is coupled to the second electrode of the fourth capacitor C4 of the band-pass filter circuit 30, and the second electrode of the thirty-eighth capacitor C38 in the high-pass filter circuit 40 is coupled to the first electrode of the thirtieth capacitor C30 in the second band-stop filter circuit 50.

Exemplarily, the thirty-eighth capacitor C38, the thirty-ninth capacitor C39, the fortieth capacitor C40, the forty-first capacitor C41, the forty-second capacitor C42, the fourteenth inductor L14, and the fifteenth inductor L15 are combined with each other, so as to filter the second signal(s), the frequency of which is less than the first frequency, among the second signals input by the band-pass filter circuit 30, retain the second signal(s), the frequency of which is not less than the first frequency, among the second signals input by the band-pass filter circuit 30, and input the retained second signal(s) as the third signal(s) into the second band-stop filter circuit 50.

In embodiments of the present disclosure, the high-pass filter circuit 40 is also simulated, and a schematic diagram of a result of simulation is as shown in FIG. 12, from which it can be seen that the high-pass filter circuit can be formed by the formation of this impedance matching network, has an excellent roll-off characteristic at the edges of the pass-band, and simultaneously ensures a certain suppression effect in the low-frequency range.

Exemplarily, the capacitance value of each of the capacitors in the filter of the present disclosure takes a value in the range of 0.1-10 pF. The inductor value of each of the inductors in the filter takes a value in the range of 0.1-10 nH.

Exemplarily, the filter of the present disclosure is formed on a glass substrate.

The filter in embodiments of the present disclosure is a high-frequency filter for eliminating interfering clutter signals and filtering the input signal or output signal to obtain a pure high-frequency signal.

Embodiments of the present disclosure provide a schematic diagram of some other structures of the filter, as shown in FIG. 13, which are deformed for the implementation in the above embodiments. Only the differences between the present embodiments and the embodiments described above are described below, and their general similarities will not be repeated herein.

In embodiments of the present disclosure, as shown in FIGS. 13 and 14, the band-pass filter circuit 30 includes: a ninth capacitor C9, a tenth capacitor C10, an eleventh capacitor C11, a twelfth capacitor C12, a thirteenth capacitor C13, a fourteenth capacitor C14, a third inductor L3, a fourth inductor L4, a fifth inductor L5, and a ground terminal GND. Herein, a first electrode of the ninth capacitor C9 is coupled to the low-pass filter circuit 20, and a second electrode of the ninth capacitor C9 is coupled to a first electrode of the tenth capacitor C10. A second electrode of the tenth capacitor C10 is coupled to the high-pass filter circuit 40. A first electrode of the eleventh capacitor C11 is coupled to the first electrode of the ninth capacitor C9, and a second electrode of the eleventh capacitor C11 is coupled to a first electrode of the twelfth capacitor C12. A second electrode of the twelfth capacitor C12 is coupled to the ground terminal GND. A first electrode of the thirteenth capacitor C13 is coupled to the second electrode of the ninth capacitor C9, and a second electrode of the thirteenth capacitor C13 is coupled to a first electrode of the fourteenth capacitor C14. A second electrode of the fourteenth capacitor C14 is coupled to the ground terminal. A first electrode of the third inductor L3 is coupled to the first electrode of the twelfth capacitor C12, and a second electrode of the third inductor L3 is coupled to the second electrode of the twelfth capacitor C12. A first electrode of the fourth inductor L4 is coupled to the first electrode of the fourteenth capacitor C14, and a second electrode of the fourth inductor L4 is coupled to the second electrode of the fourteenth capacitor C14. A first electrode of the fifth inductor L5 is coupled to the first electrode of the tenth capacitor C10, and a second electrode of the fifth inductor L5 is coupled to the second electrode of the tenth capacitor C10.

Herein, the second electrode of the thirty-third capacitor C33 in the low-pass filter circuit 20 is coupled to the first electrode of the ninth capacitor C9 in the band-pass filter circuit 30, and the first electrode of the thirty-eighth capacitor C38 in the high-pass filter circuit 40 is coupled to the second electrode of the tenth capacitor C10 in the band-pass filter circuit 30.

Exemplarily, the ninth capacitor C9, the tenth capacitor C10, the eleventh capacitor C11, the twelfth capacitor C12, the thirteenth capacitor C13, the fourteenth capacitor C14, the third inductor L3, the fourth inductor L4, and the fifth inductor L5 are combined with each other, so as to filter the first signal(s), the frequency of which is not between the third frequency and the fourth frequency, in the first signals input by the low-pass filter circuit 20, retain the first signal(s), the frequency of which is between the third frequency and the fourth frequency, in the first signals input by the low-pass filter circuit 20, and input the retained first signal(s) as the second signal(s) into the high-pass filter circuit 40.

In the embodiments of the present disclosure, the band-pass filter circuit 30 is also simulated, and a schematic diagram of a result of simulation is as shown in FIG. 15, from which it can be seen that the band-pass filter circuit 30 has multiple transmission zeros, and has a high in-band flatness and a good effect of out-of-band suppression.

Embodiments of the present disclosure provide a schematic diagram of yet some other structures of the filter, as shown in FIG. 16, which are deformed for the implementation in the above embodiments. Only the differences between the present embodiments and the above embodiments are described below, and their general similarities will not be repeated herein.

In the embodiments of the present disclosure, as shown in FIGS. 16 and 17, the band-pass filter circuit 30 includes: a fifteenth capacitor C15, a sixteenth capacitor C16, a seventeenth capacitor C17, an eighteenth capacitor C18, a nineteenth capacitor C19, a twentieth capacitor C20, a twenty-first capacitor C21, a twenty-second capacitor C22, a twenty-third capacitor C23, a twenty-fourth capacitor C24, a twenty-fifth capacitor C25, a twenty-sixth capacitor C26, a twenty-seventh capacitor C27, a twenty-eighth capacitor C28, a sixth inductor L6, a seventh inductor L7, an eighth inductor L8, a ninth inductor L9, a tenth inductor L10, and a ground terminal GND. Herein, a first electrode of the fifteenth capacitor C15 is coupled to the low-pass filter circuit 20, a second electrode of the fifteenth capacitor C15 is coupled to a first electrode of the sixteenth capacitor C16. A second electrode of the sixteenth capacitor C16 is coupled to a first electrode of the seventeenth capacitor C17. A second electrode of the seventeenth capacitor C17 is coupled to a first electrode of the eighteenth capacitor C18. A second electrode of the eighteenth capacitor C18 is coupled to a first electrode of the nineteenth capacitor C19. A second electrode of the nineteenth capacitor C19 is coupled to a first electrode of the twentieth capacitor C20. A second electrode of the twentieth capacitor C20 is coupled to the high-pass filter circuit 40. A first electrode of the twenty-first capacitor C21 is coupled to the first electrode of the seventeenth capacitor C17, and a second electrode of the twenty-first capacitor C21 is coupled to a second electrode of the twenty-second capacitor C22. A first electrode of the twenty-second capacitor C22 is coupled to the second electrode of the seventeenth capacitor C17. A first electrode of the twenty-third capacitor C23 is coupled to the second electrode of the twenty-first capacitor C21, and a second electrode of the twenty-third capacitor C23 is coupled to a first electrode of the twenty-fourth capacitor C24. A second electrode of the twenty-fourth capacitor C24 is coupled to the ground terminal GND. A first electrode of the twenty-fifth capacitor C25 is coupled to the second electrode of the eighteenth capacitor C18, and a second electrode of the twenty-fifth capacitor C25 is coupled to a first electrode of the twenty-sixth capacitor C26. A second electrode of the twenty-sixth capacitor C26 is coupled to the ground terminal GND. A first electrode of the twenty-seventh capacitor C27 is coupled to the second electrode of the nineteenth capacitor C19, and a second electrode of the twenty-seventh capacitor C27 is coupled to a first electrode of the twenty-eighth capacitor C28. A second electrode of the twenty-eighth capacitor C28 is coupled to the ground terminal GND. A first electrode of the sixth inductor L6 is coupled to the first electrode of the fifteenth capacitor C15, and a second electrode of the sixth inductor L6 is coupled to the second electrode of the fifteenth capacitor C15. A first electrode of the seventh inductor L7 is coupled to the second electrode of the twenty-second capacitor C22, and a second electrode of the seventh inductor L7 is coupled to the first electrode of the twenty-fourth capacitor C24. A first electrode of the eighth inductor L8 is coupled to the first electrode of the twenty-sixth capacitor C26, a second electrode of the eighth inductor L8 is coupled to the second electrode of the twenty-sixth capacitor C26. A first electrode of the ninth inductor L9 is coupled to the first electrode of the twenty-eighth capacitor C28, and a second electrode of the ninth inductor L9 is coupled to the second electrode of the twenty-eighth capacitor C28. A first electrode of the tenth inductor L10 is coupled to the first electrode of the twentieth capacitor C20, and a second electrode of the tenth inductor L10 is coupled to the second electrode of the twentieth capacitor C20.

Herein, the second electrode of the thirty-third capacitor C33 in the low-pass filter circuit 20 is coupled to the first electrode of the fifteenth capacitor C15 in the band-pass filter circuit 30, and the first electrode of the thirty-eighth capacitor C38 in the high-pass filter circuit 40 is coupled to the second electrode of the twentieth capacitor C20 in the band-pass filter circuit 30.

Exemplarily, the fifteenth capacitor C15, the sixteenth capacitor C16, the seventeenth capacitor C17, the eighteenth capacitor C18, the nineteenth capacitor C19, the twentieth capacitor C20, the twenty-first capacitor C21, the twenty-second capacitor C22, the twenty-third capacitor C23, the twenty-fourth capacitor C24, the twenty-fifth capacitor C25, the twenty-sixth capacitor C26, the twenty-seventh capacitor C27, the twenty-eighth capacitor C28, the sixth inductor L6, the seventh inductor L7, the eighth inductor L8, the ninth inductor L9, and the tenth inductor L10 are combined with each other, so as to filter the first signal(s), the frequency of which is not between the third frequency and the fourth frequency, in the first signals input by the low-pass filter circuit 20, retain the first signal(s), the frequency of which is between the third frequency and the fourth frequency, in the first signals input by the low-pass filter circuit 20, and input the retained first signal(s) as the second signal(s) into the high-pass filter circuit 40.

In the embodiments of the present disclosure, the band-pass filter circuit 30 is also simulated, and a schematic diagram of a result of simulation is as shown in FIG. 18, from which it can be seen that the band-pass filter circuit 30 is a filter circuit with multiple transmission zeros, and the multiple transmission zeros effectively improve the rapid attenuation at the band edges of the band-pass filter circuit 30, and effectively realize the high roll-off characteristics at both edges of the band-pass. Moreover, the band-pass filter circuit 30 can effectively make the out-of-band attenuation to be superimposed, which can form a higher out-of-band attenuation, thereby ensuring that unrequired signals such as clutter waves, secondary harmonic waves, etc., are filtered and the characteristics of the filter are improved.

Based on the same inventive concept, embodiments of the present disclosure also provide an integrated passive device including the above-described filter provided by the embodiments of the present disclosure. The principle of solving the problem by the integrated passive device is similar to that of the aforementioned filter, so the implementation of the integrated passive device can be referred to the implementation of the aforementioned filter, and the repetition will not be repeated herein.

Based on the same inventive concept, embodiments of the present disclosure also provide an electronic device including the aforementioned integrated passive device provided by the embodiments of the present disclosure. The principle of solving the problem by the electronic device is similar to that of the aforementioned integrated passive device, so the implementation of the electronic device can be referred to the implementation of the aforementioned integrated passive device, and the repetition is not repeated herein.

Exemplarily, the electronic device may be an RF device.

Based on the same inventive concept, embodiments of the present disclosure also provide a display apparatus including the aforementioned electronic device provided by the embodiments of the present disclosure. The principle of solving the problem by the display apparatus is similar to that of the aforementioned electronic device, so the implementation of the display apparatus can be referred to the implementation of the aforementioned electronic device, and the repetition is not repeated herein.

In specific implementation, in the embodiments of the present disclosure, the display apparatus may be: a cellular phone, a tablet computer, a television, a monitor, a laptop computer, a digital photo frame, a navigator, and any other product or component having a display function. Other essential components of the display apparatus are understood by those of ordinary skill in the art, and are not described herein, nor should they be taken as limitations on the present disclosure.

One of skill in the art should understand that embodiments of the present disclosure may be provided as methods, systems, or computer program products. Thus, the present disclosure may take the form of a fully hardware embodiment, a fully software embodiment, or an embodiment that combines software and hardware aspects. Further, the present disclosure may take the form of a computer program product implemented on one or more computer-usable storage medium (including, but not limited to, a disk memory, a CD-ROM, an optical memory, and the like) that contain computer-usable program code therein.

The present disclosure is described with reference to flowcharts and/or block diagrams of methods, devices (systems), and computer program products according to the embodiments of the present disclosure. It should be understood that each process and/or block in the flowcharts and/or block diagrams, and a combination of the processes and/or blocks in the flowcharts and/or block diagrams, may be implemented by computer program instructions.

These computer program instructions may be provided to a processor of a general-purpose computer, a special-purpose computer, an embedded processor, or other programmable data-processing device to produce a machine such that the instructions executed by the processor of the computer or other programmable data-processing device generate an apparatus for carrying out the functions specified in one or more processes of the flowchart and/or block diagrams, or one or more blocks of multiple flowcharts and/or block diagrams.

These computer program instructions may also be stored in a computer-readable memory capable of directing a computer or other programmable data processing device to operate in a particular manner, such that the instructions stored in the computer-readable memory generate an article of manufacture including an instruction device that implements a function specified in one or more processes of a flowchart and/or one or more blocks of a block diagram.

These computer program instructions may also be loaded onto a computer or other programmable data processing device such that a series of operational steps are performed on the computer or other programmable device to generate computer-implemented processing, such that the instructions executed on the computer or other programmable device provide steps for implementing the function specified in one or more processes of a flowchart and/or one or more blocks of a block diagram.

Although preferred embodiments of the present disclosure have been described, those skilled in the art may make additional changes and modifications to these embodiments once the underlying inventive concepts are known. Therefore, the appended claims are intended to be construed to include the preferred embodiments as well as all changes and modifications that fall within the scope of the present disclosure.

Obviously, a person skilled in the art can make various modifications and variations to the embodiments of the present disclosure without departing from the spirit and scope of the embodiments of the present disclosure. Thus, if such modifications and variations of the embodiments of the present disclosure fall within the scope of the claims of the present disclosure and their technical equivalents, the present disclosure is intended to include such modifications and variations.

What is claimed is:

1. A filter, applied in a field of radio frequency and comprising: a first port, a second port, a first band-stop filter circuit, a low-pass filter circuit, a band-pass filter circuit, and a high-pass filter circuit; wherein the first band-stop filter circuit is coupled to the first port and is configured to perform out-of-band suppression on a signal input from the first port and input a signal subjected to the out-of-band suppression to the low-pass filter circuit;

the low-pass filter circuit is configured to input a first signal of the signal input by the first band-stop filter circuit to the band-pass filter circuit, wherein the first signal has a frequency between a first frequency and a second frequency;

the band-pass filter circuit is configured to input a second signal of the first signal input by the low-pass filter circuit to the high-pass filter circuit, wherein the second signal has a frequency between a third frequency and a fourth frequency; and the high-pass filter circuit is configured to pass through a third signal of the second signal input by the band-pass filter circuit, wherein the third signal has a frequency not less than the first frequency;

wherein the first frequency is less than the second frequency;

the third frequency is between the first frequency and the second frequency; and the fourth frequency is between the third frequency and the second frequency.

2. The filter according to claim 1, comprising: a second band-stop filter circuit;

the high-pass filter circuit is coupled to the second port through the second band-stop filter circuit; and the second band-stop filter circuit is coupled to the second port, and is configured to perform out-of-band suppression on the third signal passed by the high-pass filter circuit and input a signal subjected to out-of-band suppression to the second port.

3. The filter according to claim 1, wherein the band-pass filter circuit comprises: a first capacitor, a second capacitor, a third capacitor, a fourth capacitor, a fifth capacitor, a sixth capacitor, a seventh capacitor, an eighth capacitor, a first inductor, a second inductor, and a ground terminal;

a first electrode of the first capacitor is coupled to the low-pass filter circuit, and a second electrode of the first capacitor is coupled to a first electrode of the second capacitor;

a second electrode of the second capacitor is coupled to a first electrode of the third capacitor;

a second electrode of the third capacitor is coupled to a first electrode of the fourth capacitor;

a second electrode of the fourth capacitor is coupled to the high-pass filter circuit;

a first electrode of the fifth capacitor is coupled to the first electrode of the third capacitor, and a second electrode of the fifth capacitor is coupled to a second electrode of the sixth capacitor;

a first electrode of the sixth capacitor is coupled to the second electrode of the third capacitor;

a first electrode of the seventh capacitor is coupled to the second electrode of the fifth capacitor, and a second electrode of the seventh capacitor is coupled to a first electrode of the eighth capacitor;

a second electrode of the eighth capacitor is coupled to the ground terminal;

a first electrode of the first inductor is coupled to the first electrode of the first capacitor, and a second electrode of the first inductor is coupled to the second electrode of the first capacitor; and a first electrode of the second inductor is coupled to the second electrode of the sixth capacitor, and a second electrode of the second inductor is coupled to the first electrode of the eighth capacitor.

4. The filter according to claim 1, wherein the band-pass filter circuit comprises: a ninth capacitor, a tenth capacitor, an eleventh capacitor, a twelfth capacitor, a thirteenth capacitor, a fourteenth capacitor, a third inductor, a fourth inductor, a fifth inductor, and a ground terminal;

a first electrode of the ninth capacitor is coupled to the low-pass filter circuit, and a second electrode of the ninth capacitor is coupled to a first electrode of the tenth capacitor;

a second electrode of the tenth capacitor is coupled to the high-pass filter circuit;

a first electrode of the eleventh capacitor is coupled to the first electrode of the ninth capacitor, and a second electrode of the eleventh capacitor is coupled to a first electrode of the twelfth capacitor;

a second electrode of the twelfth capacitor is coupled to the ground terminal;

a first electrode of the thirteenth capacitor is coupled to the second electrode of the ninth capacitor, and a second electrode of the thirteenth capacitor is coupled to a first electrode of the fourteenth capacitor;

a second electrode of the fourteenth capacitor is coupled to the ground terminal;

a first electrode of the third inductor is coupled to the first electrode of the twelfth capacitor, and a second electrode of the third inductor is coupled to the second electrode of the twelfth capacitor;

a first electrode of the fourth inductor is coupled to the first electrode of the fourteenth capacitor, and a second electrode of the fourth inductor is coupled to the second electrode of the fourteenth capacitor; and a first electrode of the fifth inductor is coupled to the first electrode of the tenth capacitor, and a second electrode of the fifth inductor is coupled to the second electrode of the tenth capacitor.

5. The filter according to claim 1, wherein the band-pass filter circuit comprises: a fifteenth capacitor, a sixteenth capacitor, a seventeenth capacitor, an eighteenth capacitor, a nineteenth capacitor, a twentieth capacitor, a twenty-first capacitor, a twenty-second capacitor, a twenty-third capacitor, a twenty-fourth capacitor, a twenty-fifth capacitor, a twenty-sixth capacitor, a twenty-seventh capacitor, a twenty-eighth capacitor, a sixth inductor, a seventh inductor, an eighth inductor, a ninth inductor, a tenth inductor, and a ground terminal;

a first electrode of the fifteenth capacitor is coupled to the low-pass filter circuit, and a second electrode of the fifteenth capacitor is coupled to a first electrode of the sixteenth capacitor;

a second electrode of the sixteenth capacitor is coupled to a first electrode of the seventeenth capacitor;

a second electrode of the seventeenth capacitor is coupled to a first electrode of the eighteenth capacitor;

a second electrode of the eighteenth capacitor is coupled to a first electrode of the nineteenth capacitor;

a second electrode of the nineteenth capacitor is coupled to a first electrode of the twentieth capacitor a second electrode of the twentieth capacitor is coupled to the high-pass filter circuit;

a first electrode of the twenty-first capacitor is coupled to the first electrode of the seventeenth capacitor, and a second electrode of the twenty-first capacitor is coupled to a second electrode of the twenty-second capacitor;

a first electrode of the twenty-second capacitor is coupled to the second electrode of the seventeenth capacitor;

a first electrode of the twenty-third capacitor is coupled to the second electrode of the twenty-first capacitor, and a second electrode of the twenty-third capacitor is coupled to a first electrode of the twenty-fourth capacitor;

a second electrode of the twenty-fourth capacitor is coupled to the ground terminal;

a first electrode of the twenty-fifth capacitor is coupled to the second electrode of the eighteenth capacitor, and a second electrode of the twenty-fifth capacitor is coupled to a first electrode of the twenty-sixth capacitor;

a second electrode of the twenty-sixth capacitor is coupled to the ground terminal;

a first electrode of the twenty-seventh capacitor is coupled to the second electrode of the nineteenth capacitor, and a second electrode of the twenty-seventh capacitor is coupled to a first electrode of the twenty-eighth capacitor;

a second electrode of the twenty-eighth capacitor is coupled to the ground terminal;

a first electrode of the sixth inductor is coupled to the first electrode of the fifteenth capacitor, and a second electrode of the sixth inductor is coupled to the second electrode of the fifteenth capacitor;

a first electrode of the seventh inductor is coupled to the second electrode of the twenty-second capacitor, and a second electrode of the seventh inductor is coupled to the first electrode of the twenty-fourth capacitor;

a first electrode of the eighth inductor is coupled to the first electrode of the twenty-sixth capacitor, and a second electrode of the eighth inductor is coupled to the second electrode of the twenty-sixth capacitor;

a first electrode of the ninth inductor is coupled to the first electrode of the twenty-eighth capacitor, and a second electrode of the ninth inductor is coupled to the second electrode of the twenty-eighth capacitor; and a first electrode of the tenth inductor is coupled to the first electrode of the twentieth capacitor, and a second electrode of the tenth inductor is coupled to the second electrode of the twentieth capacitor.

6. The filter according to claim 1, wherein the first band-stop filter circuit comprises: a twenty-ninth capacitor, and an eleventh inductor;

a first electrode of the twenty-ninth capacitor is coupled to the first port, and a second electrode of the twenty-ninth capacitor is coupled to the low-pass filter circuit; and a first electrode of the eleventh inductor coupled to the first electrode of the twenty-ninth capacitor, and the second electrode of the eleventh inductor coupled to the second electrode of the twenty-ninth capacitor.

7. The filter according to claim 2, wherein the second band-stop filter circuit comprises: a thirtieth capacitor, and a twelfth inductor;

a first electrode of the thirtieth capacitor is coupled to the high-pass filter circuit, and a second electrode of the thirtieth capacitor is coupled to the second port; and a first electrode of the twelfth inductor coupled to a first electrode of the thirtieth capacitor, and a second electrode of the twelfth inductor coupled to the second electrode of the thirtieth capacitor.

8. The filter according to claim 1, wherein the low-pass filter circuit comprises: a thirty-first capacitor, a thirty-second capacitor, a thirty-third capacitor, a thirty-fourth capacitor, a thirty-fifth capacitor, a thirty-sixth capacitor, a thirty-seventh capacitor, a thirteenth inductor, and a ground terminal;

a first electrode of the thirty-first capacitor is coupled to the first band-stop filter circuit, and a second electrode of the thirty-first capacitor is coupled to a first electrode of the thirty-second capacitor;

a second electrode of the thirty-second capacitor is coupled to a first electrode of the thirty-third capacitor;

a second electrode of the thirty-third capacitor is coupled to the band-pass filter circuit;

a first electrode of the thirty-fourth capacitor is coupled to the first electrode of the thirty-second capacitor, and a second electrode of the thirty-fourth capacitor is coupled to a second electrode of the thirty-fifth capacitor;

a first electrode of the thirty-fifth capacitor is coupled to the second electrode of the thirty-second capacitor;

a first electrode of the thirty-sixth capacitor is coupled to the second electrode of the thirty-fourth capacitor, and a second electrode of the thirty-sixth capacitor is coupled to a first electrode of the thirty-seventh capacitor;

a second electrode of the thirty-seventh capacitor is coupled to the ground terminal; and a first electrode of the thirteenth inductor is coupled to the second electrode of the thirty-fifth capacitor, and a second electrode of the thirteenth inductor is coupled to the first electrode of the thirty-seventh capacitor.

9. The filter according to claim 2, wherein the high-pass filter circuit comprises: a thirty-eighth capacitor, a thirty-ninth capacitor, a fortieth capacitor, a forty-first capacitor, a forty-second capacitor, a fourteenth inductor, a fifteenth inductor, and a ground terminal;

a first electrode of the thirty-eighth capacitor is coupled to the band-pass filter circuit, and a second electrode of the thirty-eighth capacitor is coupled to the second band-stop filter circuit;

a first electrode of the thirty-ninth capacitor is coupled to the first electrode of the thirty-eighth capacitor, and a second electrode of the thirty-ninth capacitor is coupled to a first electrode of the fortieth capacitor;

a second electrode of the fortieth capacitor is coupled to the ground terminal;

a first electrode of the forty-first capacitor is coupled to the second electrode of the thirty-eighth capacitor, and a second electrode of the forty-first capacitor is coupled to a first electrode of the forty-second capacitor;

a second electrode of the forty-second capacitor is coupled to the ground terminal;

a first electrode of the fourteenth inductor is coupled to the first electrode of the fortieth capacitor, and a second electrode of the fourteenth inductor is coupled to the second electrode of the fortieth capacitor; and a first electrode of the fifteenth inductor is coupled to the first electrode of the forty-second capacitor, and a second electrode of the fifteenth inductor is coupled to the second electrode of the forty-second capacitor.

10. The filter according to claim 1, wherein a capacitance value of each of the capacitors in the filter is in a range of 0.1-10 pF.

11. The filter according to claim 1, wherein an inductor value of each of the inductors in the filter is in a range of 0.1-10 nH.

12. The filter according to claim 1, wherein the filter is formed on a glass substrate.

13. The filter according to claim 1, wherein the filter is a high frequency filter.

14. An integrated passive device, comprising a filter, wherein the filter is applied in a field of radio frequency and comprises: a first port, a second port, a first band-stop filter circuit, a low-pass filter circuit, a band-pass filter circuit, and a high-pass filter circuit; wherein the first band-stop filter circuit is coupled to the first port and is configured to perform out-of-band suppression on a signal input from the first port and input a signal subjected to the out-of-band suppression to the low-pass filter circuit;

the low-pass filter circuit is configured to input a first signal of the signal input by the first band-stop filter circuit to the band-pass filter circuit, wherein the first signal has a frequency between a first frequency and a second frequency;

the band-pass filter circuit is configured to input a second signal of the first signal input by the low-pass filter circuit to the high-pass filter circuit, wherein the second signal has a frequency between a third frequency and a fourth frequency; and the high-pass filter circuit is configured to pass through a third signal of the second signal input by the band-pass filter circuit, wherein the third signal has a frequency not less than the first frequency;

wherein the first frequency is less than the second frequency;

the third frequency is between the first frequency and the second frequency; and the fourth frequency is between the third frequency and the second frequency.

15. An electronic device, comprising an integrated passive device, wherein the integrated passive device comprises a filter, wherein the filter is applied in a field of radio frequency and comprises: a first port, a second port, a first band-stop filter circuit, a low-pass filter circuit, a band-pass filter circuit, and a high-pass filter circuit; wherein the first band-stop filter circuit is coupled to the first port and is configured to perform out-of-band suppression on a signal input from the first port and input a signal subjected to the out-of-band suppression to the low-pass filter circuit;

the low-pass filter circuit is configured to input a first signal of the signal input by the first band-stop filter circuit to the band-pass filter circuit, wherein the first signal has a frequency between a first frequency and a second frequency;

the band-pass filter circuit is configured to input a second signal of the first signal input by the low-pass filter circuit to the high-pass filter circuit, wherein the second signal has a frequency between a third frequency and a fourth frequency; and the high-pass filter circuit is configured to pass through a third signal of the second signal input by the band-pass filter circuit, wherein the third signal has a frequency not less than the first frequency;

wherein the first frequency is less than the second frequency;

the third frequency is between the first frequency and the second frequency; and the fourth frequency is between the third frequency and the second frequency.

16. A display apparatus, comprising the electronic device according to claim 15.

* * * * *